United States Patent [19]

Hayashi

[11] Patent Number: 4,467,449

[45] Date of Patent: Aug. 21, 1984

[54] SEMICONDUCTOR INTEGRATED CIRCUIT

[75] Inventor: Mineo Hayashi, Tokyo, Japan

[73] Assignee: Nippon Electric Co., Ltd., Tokyo, Japan

[21] Appl. No.: 298,412

[22] Filed: Sep. 1, 1981

[30] Foreign Application Priority Data

Sep. 1, 1980 [JP] Japan ................................. 55-121481

[51] Int. Cl.$^3$ .............................................. G11C 7/00
[52] U.S. Cl. ...................................... 365/51; 365/203
[58] Field of Search ............... 365/189, 203, 207, 208, 365/210, 214, 51, 182, 205, 218, 226

[56] References Cited

U.S. PATENT DOCUMENTS 4,069,474  1/1978  Boettcher et al. .................. 365/205
4,130,896 12/1978  Inadachi ............................. 365/203
4,156,939  5/1979  Takemae et al. .................... 365/182
4,351,034  9/1982  Eaton, Jr. et al. .................. 365/189

Primary Examiner—George G. Stellar
Attorney, Agent, or Firm—Sughrue, Mion, Zinn, Macpeak, and Seas

[57] ABSTRACT

An improved integrated circuit in which capacitive loads can be driven at a high speed is disclosed. The circuit comprises a first and a second capacitive loads disposed separately from each other, a first switch located near the first capacitive load and adapted to drive it with a power source, a second switch located near the second capacitive load and adapted to drive it with the power source, and means for simultaneously controlling the first and second switch.

10 Claims, 9 Drawing Figures

SEMICONDUCTOR INTEGRATED CIRCUIT

BACKGROUND OF THE INVENTION

The present invention relates to a semiconductor integrated circuit, and more particularly to an improved layout of a switching circuit in a semiconductor integrated circuit.

In recent years, high-density circuit integration has remarkably progressed as represented by dynamic MOS memories. In proportion to such high-density circuit integration, a number of circuits adapted to receive a switching signal generated by one switching circuit has been increased. For instance, in a 64-kilobit dynamic memory, 512 digit lines are simultaneously precharged in response to the same switching signal. More particularly, at least 512 precharging insulated gate field effect transistors (IGFET's) connected to the 512 digit lines must be controlled by the single switching signal. Therefore, a resistance of wirings connecting the respective IGFET's and the switching signal generator and total gate capacitances of the IGFET's become very large. This means that the time constant of the load of the single switching signal is very large and the switching speed is eventually lowered.

If the width of the wirings is broadened, the resistance of the wirings can be reduced, but a high density arrangement of circuit elements is remarkably prevented. Therefore, this measure is not practical.

It is a matter of course that such problem exists not only in a precharge circuit but also, for example, in the case where the same timing or switching signal is fed to a large number of IGFET's.

SUMMARY OF THE INVENTION

It is therefore an object of the present invention to provide an integrated circuit which can achieve a high speed operation.

Another object of the present invention is to provide a semiconductor integrated circuit which is suitable for high-density integration and which has an improved switching speed.

According to the present invention, the integrated circuit comprises means for generating a switching signal in response to an input signal and a plurality of mutually isolated capacitive loads driven by the switching signal and is featured in that the switching signal generating means includes a plurality of IGFET's disposed near the capacitive loads and generating switching signals in response to the same input signal, the respective switching signals being transferred to the near-by capacitive loads.

According to another feature of the present invention, a semiconductor device comprises a series connection of drain-source paths of equivalently two field effect transistors and a plurality of capacitive loads connected to the junction of the drain-source paths, at least one of the equivalently two transistors being comprised of a plurality of field effect transistors connected in parallel, and the respective ones of these plurality of field effect transistors being disposed in the vicinity of the capacitive loads.

According to the present invention, a resistance of wirings connecting capacitive loads and the switching signal generator can be effectively reduced, and hence high speed switching can be performed. Moreover, the present invention can be practiced by merely modifying a layout of a semiconductor device without a substantial increase in cost.

DETAILED DESCRIPTION OF THE PRIOR ART

Figure 1:
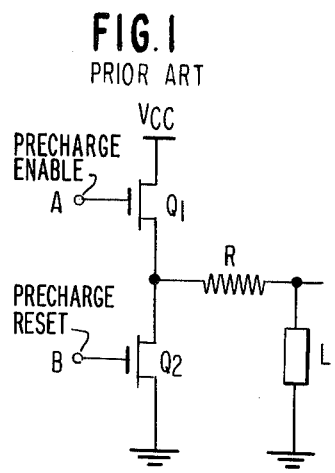
FIG. 1 is a circuit diagram showing a switching circuit in the prior art.

A representative switching circuit which has been used in the prior art, is illustrated in FIG. 1. In this circuit, a drain and a source of an IGFET $Q_1$ are connected to a power supply $V_{cc}$ and a drain of another IGFET $Q_2$, respectively, and the source of the IGFET $Q_2$ is grounded. When a load L is connected between a junction of the IGFET's $Q_1$ and $Q_2$ and the ground, a voltage applied across the load L can be switched in response to input signals A and B applied to the respective gate electrodes of the IGFET's $Q_1$ and $Q_2$.

Assuming now that the load L is capacitive, then a time constant circuit is inevitably formed by the capacitance of this load L and a resistance R of the lead wire connecting the IGFET's $Q_1$ and $Q_2$ to the load L, and the time constant of the circuit would introduce a limitation to the operation speed of the switching circuit.

When the switching circuit and the load L are both fabricated as a part of an integrated circuit in a semiconductor substrate, and if the capacitance of the load is inevitable, then in order to enhance a switching speed it is necessary to reduce the resistance R of the lead wire.

Figure 2:
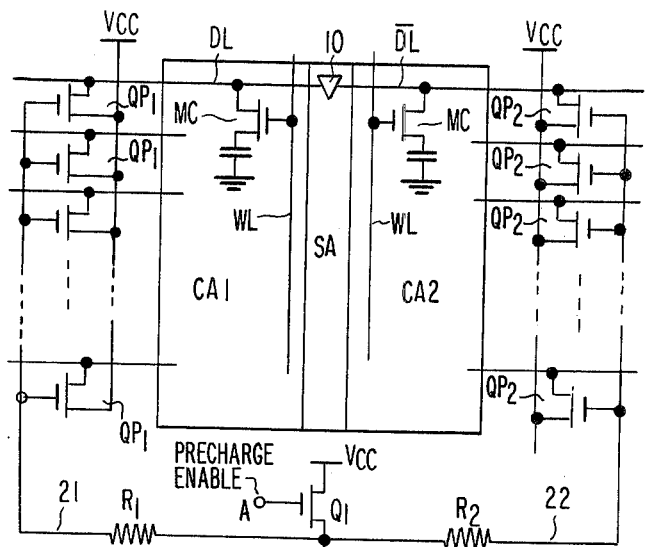
FIG. 2 is a schematic block diagram showing a memory device in the prior art.

The operation of the switching circuit in the prior art will be explained in greater detail with reference to a practical example of the circuit. A structure of one practical example of a prior art semiconductor memory device is illustrated in FIG. 2. In this memory device, memory cells MC are arrayed as two cell arrays CA1 and CA2 in two separate areas and connected to the respective digit lines DL and $\overline{DL}$ and the respective word lines WL. In an area SA between the two cell arrays CA1 and CA2, sense amplifiers 10 are arrayed, whose inputs are respectively connected to the digit lines DL and the digit lines $\overline{DL}$. The respective digit lines DL and $\overline{DL}$ are provided with IGFET's $QP_1$ and $QP_2$, respectively, for precharging these digit lines to a power supply voltage $V_{cc}$. To the gates of these IGFET's $QP_1$ and $QP_2$ is applied, via wirings 21 and 22 respectively, an output of a switching circuit formed of an IGFET $Q_1$ having a precharge enable signal A applied to its gate and an IGFET $Q_2$ having a precharge reset signal B applied to its gate.

The circuit formed of the IGFET's $Q_1$ and $Q_2$ is similar to the switching circuit explained above with reference to FIG. 1, and a large number of IGFET's $QP_1$ and $QP_2$ for different digit lines DL and $\overline{DL}$ are connected to this switching circuit as its load. The gates of these IGFET's $QP_1$ and $QP_2$ are equivalently capacitive. And hence, owing to resistances $R_1$ and $R_2$ produced in the wirings 21 and 22 leading to the two groups of IGFET's, the load of the switching circuit is considered as a CR circuit having a definite time constant. Accordingly, the operation speed of these two groups of IGFET's $QP_1$ and $QP_2$ controlled by the switching circuit is lowered by the time constant.

DETAILED DESCRIPTION OF THE INVENTION

Figure 3:
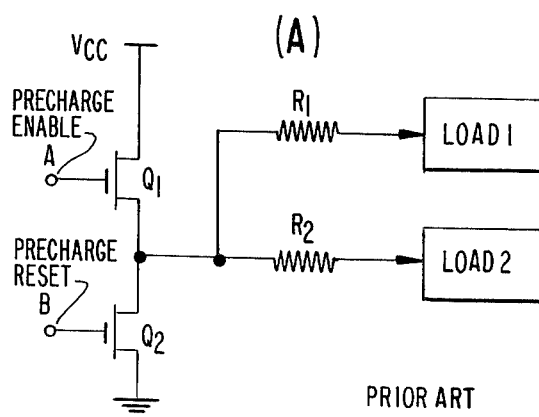
FIG. 3 is a schematic view to be used for explaining the present invention, FIG. 3(A) being a schematic view showing a model of a switching circuit in the prior art, and FIG. 3(B) being a schematic view showing a model of a basic construction according to the present invention.

Now the inventive concept of the present invention will be described with reference to FIG. 3.

FIG. 3(A) schematically shows a relation in the prior art between a switching circuit composed of IGFET's $Q_1$ and $Q_2$ and its loads. A switching signal generated by IGFET's $Q_1$ and $Q_2$ is transmitted to two capacitive loads LOAD1 and LOAD2 via wiring $R_1$ and $R_2$, respectively. Representing the capacitances of the respective capacitive loads LOAD1 and LOAD2 by CL1 and CL2, respectively, time constants of $R_1 \times CL1$ and $R_2 \times CL2$ are defined for the loads LOAD1 and LOAD2, respectively.

On the other hand, FIG. 3(B) illustrates one example of basic circuit structure according to the present invention. In this example, a load IGFET in a switching circuit is formed of two IGFET's $Q_{11}$ and $Q_{12}$. The respective load IGFET's $Q_{11}$ and $Q_{12}$ have a size smaller than the IGFET $Q_1$ in FIG. 3(A) and are disposed in the vicinity of the respective loads LOAD1 and LOAD2. Accordingly, the wiring between the source terminal of the IGFET $Q_{11}$ and the load LOAD1 can be made very short, and hence a wiring resistance $r_1$ therebetween can be suppressed to a small value. Likewise, a wiring resistance $r_2$ between the IGFET $Q_{12}$ and the load LOAD2 can be suppressed to a small value. Therefore, the time constants $r_1 \times CL1$ and $r_2 \times CL2$ for the respective loads LOAD1 and LOAD2 can be reduced to very small values as compared to the circuit structure shown in FIG. 3(A), and thereby a high speed operation can be achieved.

In the above-described parallel structure of the IGFET's $Q_{11}$ and $Q_{12}$, the electrical properties, especially mutual conductances $\beta$ of these IGFET's are selected so that these parallel-connected IGFET's as a whole may be electrically equivalent to the single IGFET $Q_1$ in FIG. 3(A). To that end, the respective IGFET's $Q_{11}$ and $Q_{12}$ are formed so as to have a mutual conductance $\beta$ that is a half of that of the IGFET $Q_1$. For that purpose it is only necessary to select the physical size of the IGFET's $Q_{11}$ and $Q_{12}$ to be $\frac{1}{2}$ times as small as that of the IGFET $Q_1$. For instance, assuming that the channel lengths are identical between the IGFET $Q_1$ and the IGFET's $Q_{11}$ and $Q_{12}$, it is only necessary to select the channel widths of the IGFET's $Q_{11}$ and $Q_{12}$ to be $\frac{1}{2}$ times as small as that of the IGFET $Q_1$. As a result, the area of the IGFET's $Q_{11}$ and $Q_{12}$ can be made about a half of that of the IGFET $Q_1$. This increase flexibility in layout, and contributes to high-density layout. This will be explained in more detail with reference to FIGS. 4 and 5.

Figure 4:
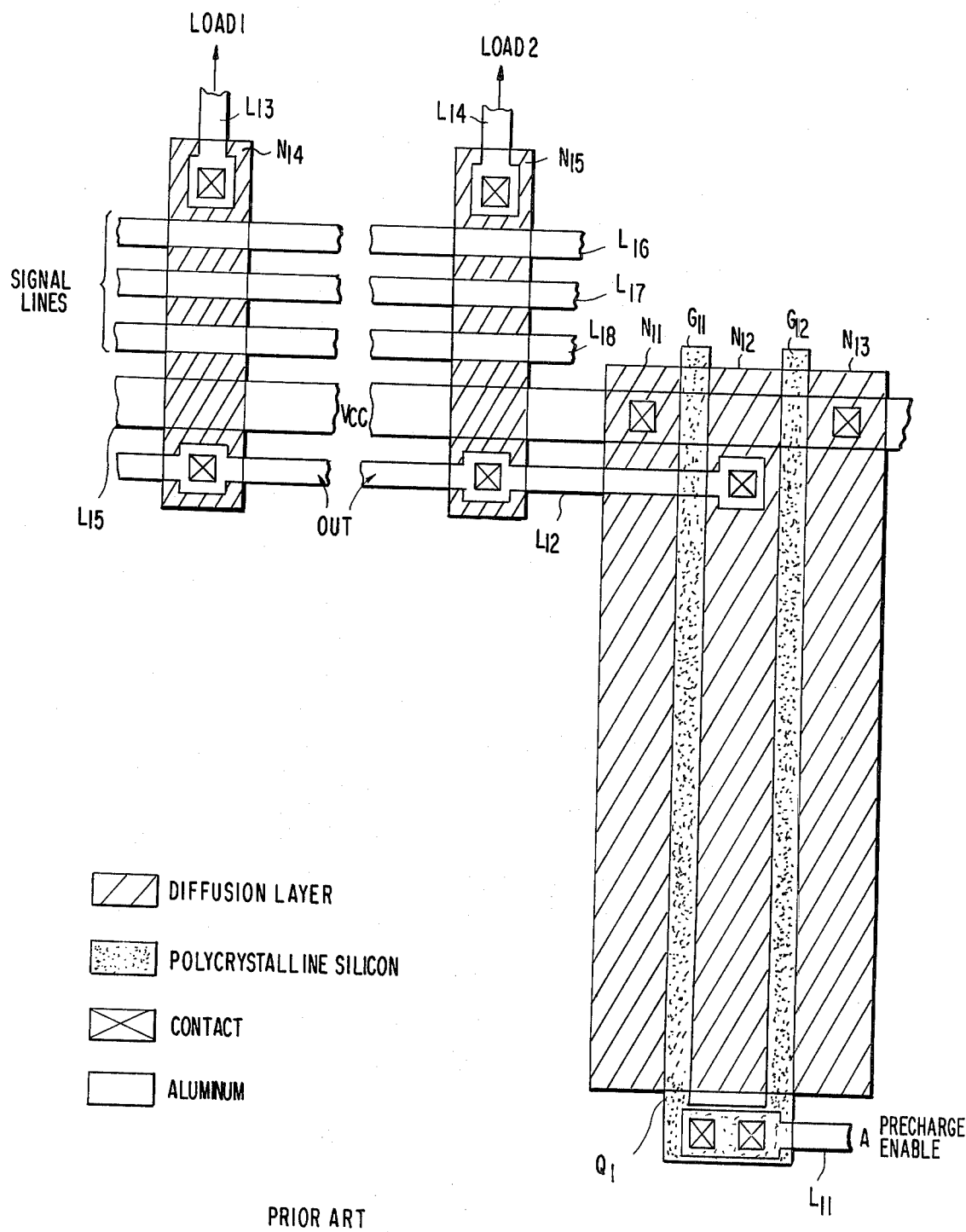
FIG. 4 is a schematic view showing a layout of a switching circuit corresponding to FIG. 3(A)

FIG. 4 shows one example of layout of the circuit structure in the prior art illustrated in FIG. 3(A). In the IGFET $Q_1$, a drain region is formed of two isolated N-type regions $N_{11}$ and $N_{13}$, and a source region is formed of an N-type region $N_{12}$. Silicon gates $G_{11}$ and $G_{12}$ are provided between the drain region and source region, and they are connected in common to each other and to an input wiring $L_{11}$ at the portions outside of the channel regions. At output wiring $L_{12}$ connected to the source region $N_{12}$ is extended in the lateral direction, and wirings $L_{13}$ and $L_{14}$ leading to loads LOAD1 and LOAD2, respectively, are derived from the output wiring $L_{12}$ via N-type regions $N_{14}$ and $N_{15}$, respectively, which regions cross with signal lines $L_{16}$ to $L_{18}$ which are irrelevant to this switching circuit. Here it will be understood that the IGFET $Q_1$ necessitates a very large integral layout space.

Figure 5:
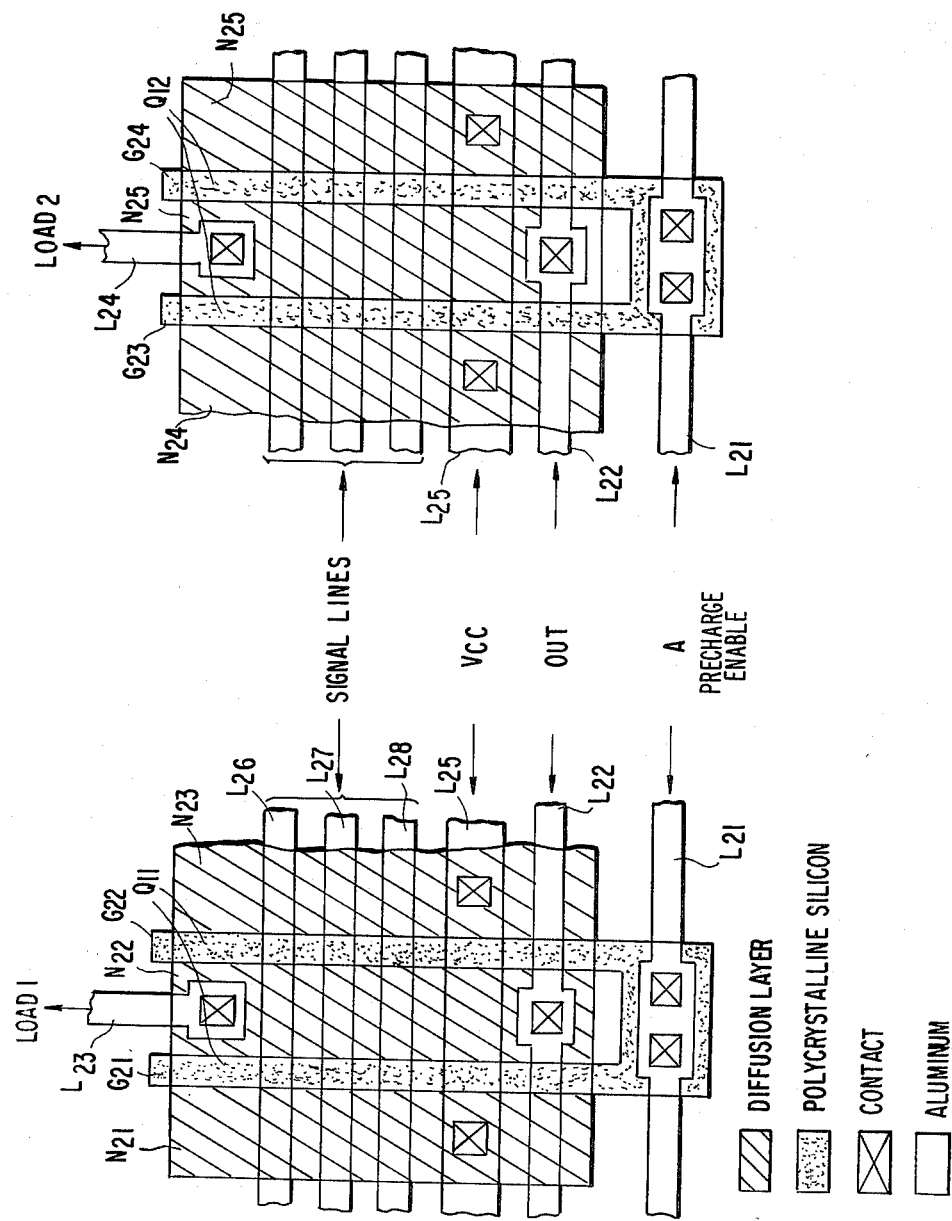
FIG. 5 is a schematic view showing a layout of switching circuit corresponding to FIG. 3(B)

FIG. 5 shows one example of layout of the basic circuit structure according to the present invention illustrated in FIG. 3(B). In this layout, an IGFET $Q_{11}$ comprises N-type regions $N_{21}$ and $N_{23}$ serving as drain regions, an N-type region $N_{22}$ serving as a source region, and silicon gates $G_{21}$ and $G_{22}$ disposed between these drain regions and source region. The silicon gates $G_{21}$ and $G_{22}$ are connected in common to an input wiring $L_{21}$. The drain regions $N_{21}$ and $N_{23}$ are connected to a wiring $L_{25}$ for a power supply ($V_{cc}$) via contacts. Output to a load LOAD1 is effected by deriving a wiring $L_{23}$ from a portion of the source region $N_{22}$ in the vicinity of its one end. On the other hand, series connection to a driver transistor IGFET $Q_2$ is effected by connecting a wiring $L_{22}$ to a portion of the source region $N_{22}$ in the vicinity of the other end thereof. Likewise, in the other IGFET $Q_{12}$ also, output to a load LOAD2 is effected by deriving a wiring $L_{24}$ from a portion of the N-type source region $N_{25}$ near its one end, and series connection to the IGFET $Q_2$ is effected by connecting a wiring $L_{22}$ to a portion of the source region $N_{25}$ near the other end thereof. In this layout, other circuit wirings $L_{26}$ to $L_{28}$ extend so as to cross over the silicon gates $G_{21}$ to $G_{24}$. Therefore, according to the present invention, the space necessitated for the IGFET $Q_1$ in the prior art can be substantially spared, and the respective IGFET's $Q_{11}$ and $Q_{12}$ can be formed under coexistence with other circuit wirings. Consequently, the present invention largely contributes to high-density circuit integration.

Figure 6:
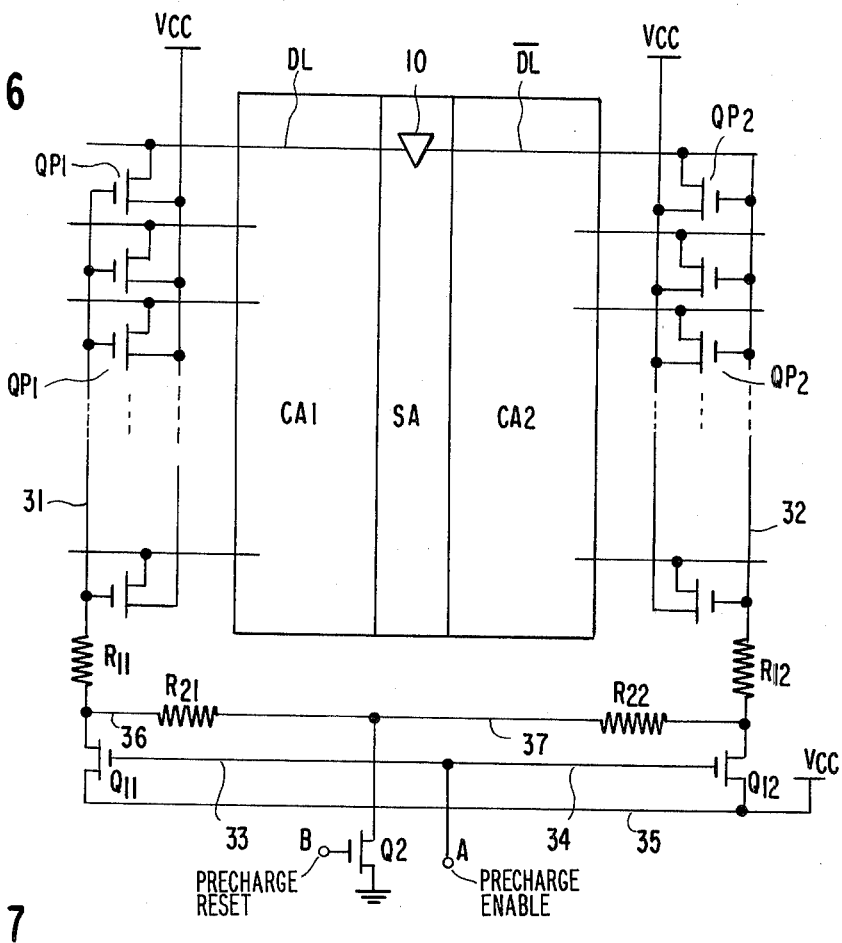
FIG. 6 is a schematic block diagram showing one preferred embodiment of the present invention.

Now one preferred embodiment of the present invention as applied to a memory device will be described with reference to FIG. 6. In this preferred embodiment, the present invention is applied to the IGFET $Q_1$ in the circuit structure in the prior art illustrated in FIG. 2.

On the left side of a memory cell array CA1, precharge IGFET's $QP_1$ are provided for the respective digit lines DL, and precharge IGFET's $QP_2$ for the respective digit lines $\overline{DL}$ are provided on the right side of a memory cell array CA2. In a region SA, source amplifiers 10 are disposed for the respective digit line pairs. Gate electrodes of the precharge IGFET's $QP_1$ are connected in common to a wiring 31, and gate electrodes of the precharge IGFET's $QP_2$ are connected in common to a wiring 32. In this circuit structure, the IGFET $Q_1$ in FIG. 2 is divided into two IGFET's $Q_{11}$ and $Q_{12}$, and the respective corresponding electrodes of the two IGFET's $Q_{11}$ and $Q_{12}$ are mutually connected so that thus parallel-connected IGFET's $Q_{11}$ and $Q_{12}$ may be equivalent to the single IGFET $Q_1$. Moreover, these two IGFET's $Q_{11}$ and $Q_{12}$ are disposed in the vicinity of the respective precharge IGFET groups, and thereby the wiring resistances $R_{11}$ and $R_{12}$ between the wiring 31 and the IGFET $Q_{11}$ and between the wiring 32 and the IGFET $Q_{12}$ are minimized.

In the above-described circuit structure, the wiring resistances provided between the switching circuit and the respective loads are the minimized resistances $R_{11}$ and $R_{12}$, which are far smaller than the wiring resistances $R_1$ and $R_2$ in the circuit structure in the prior art illustrated in FIG. 2. Accordingly, when the parallel circuit consisting of the IGFET's $Q_{11}$ and $Q_{12}$ becomes conducting, that is, when the switching circuit turns ON, the time constant of the circuit becomes far smaller than that in the prior art. In this improved circuit structure, although a gate wiring 33 for the IGFET $Q_{11}$ and a gate wiring 34 for the IGFET $Q_{12}$ are additionally provided as compared to the circuit structure in the prior art illustrated in FIG. 2, increases in a time constant caused by the wirings 33 and 34 can be substantially disregarded because the gate capacitances of the respective IGFET's $Q_{11}$ and $Q_{12}$ are small and they are far smaller than the load capacitances of the precharge gate IGFET groups. However, when the IGFET $Q_2$ becomes conducting and the switching circuit turns OFF, resistances $R_{21}$ and $R_{22}$ of the wirings 36 and 37 act effectively, and so, the time constant cannot become small. Therefore, the preferred embodiment illustrated in FIG. 6 beings about an excellent effect in high speed rising operations of precharge transistor groups.

Figure 7:
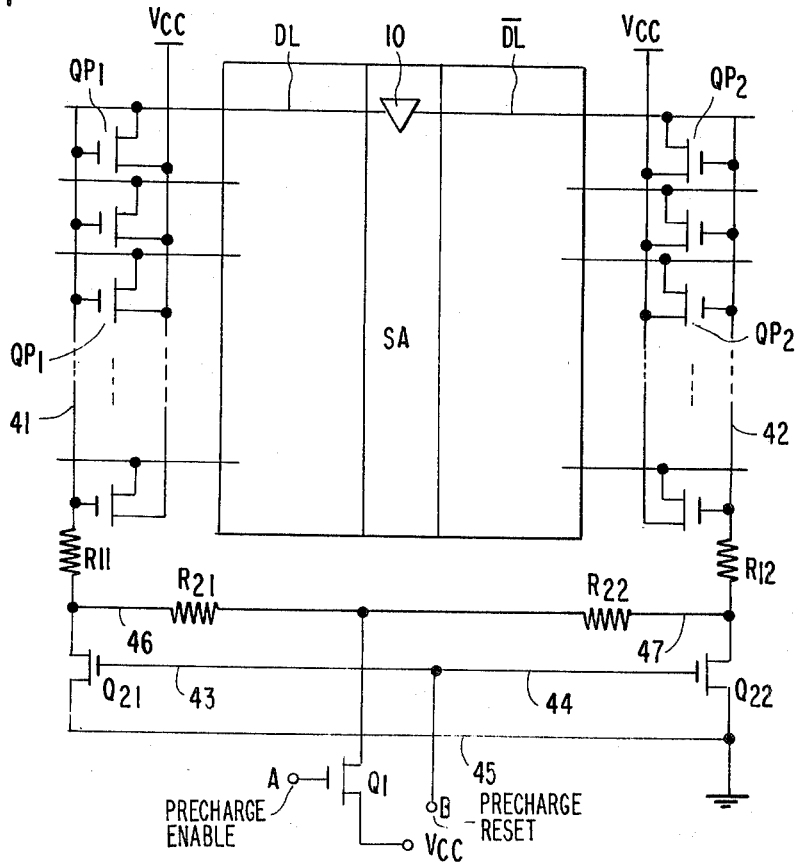
FIG. 7 is a schematic block diagram showing another preferred embodiment of the present invention.

A circuit structure according to another preferred embodiment of the present invention is illustrated in FIG. 7. In this circuit structure, the IGFET $Q_2$ in FIG. 2 is replaced by two IGFET's $Q_{21}$ and $Q_{22}$, and these IGFET's $Q_{21}$ and $Q_{22}$ are disposed in the vicinity of the respective precharge IGFET's $QP_2$ and $QP_1$. In this preferred embodiment, when the switching circuit turns OFF, minimized resistances $R_{11}$ and $R_{12}$ of wirings 41 and 42 act effectively and the time constant of the circuit becomes small. Accordingly, the operation speed of the circuit is enhanced. However, when the switching circuit turns ON, resistances $R_{21}$ and $R_{22}$ of wirings 46 and 47 act effectively. Hence, the time constant cannot become small. In this modified embodiment also, increase in a time constant caused by wirings 43 and 44 is negligibly small for the same reason as that described above in connection to the wirings 33 and 34 in FIG. 6. Accordingly, this modified embodiment is effective for high-speed cut-off control of precharge gates.

Figure 8:
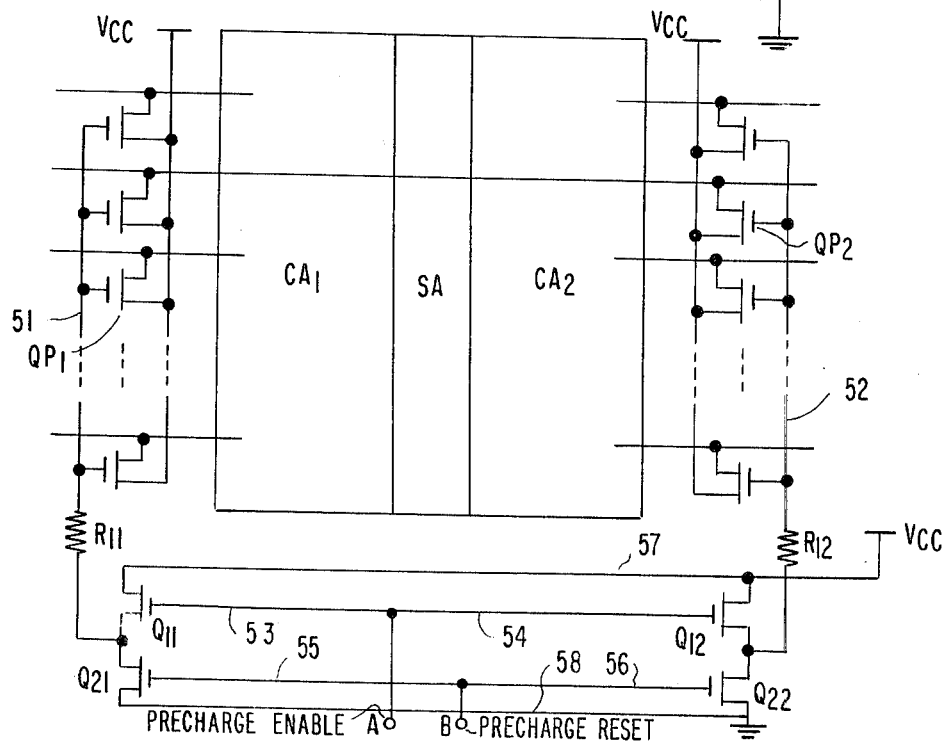
FIG. 8 is a schematic block diagram showing still another preferred embodiment of the present invention.

A third preferred embodiment of the present invention is illustrated in FIG. 8. In this embodiment, the feature of the present invention illustrated in FIG. 6 and the feature illustrated in FIG. 7 are incorporated in combination. In this circuit construction, the IGFET $Q_1$ in FIG. 2 is divided into two IGFET's $Q_{11}$ and $Q_{12}$, and the IGFET $Q_2$ in FIG. 2 is divided into two IGFET's $Q_{21}$ and $Q_{22}$. In this embodiment also, the gate wirings 53 to 56 leading to these respective IGFET's $Q_{11}$, $Q_{12}$, $Q_{21}$ and $Q_{22}$ have a negligibly small time constant for the above-mentioned reasons. This circuit can achieve high speed operations at both the rising and falling (cut-off) points of the switching signal.

While the present invention has been described above, by way of example, as applied to precharge IGFET's in a memory, it is obvious that the present invention is not limited to the above-described embodiments but is widely applicable to switching circuits for driving capacitive loads having large capacitances.

I claim:

1. An integrated circuit comprising a first means for receiving a first control signal, a first group of a plurality of insulated gate field effect transistors, a second group of insulated gate field effect transistors located distinctly from said first group of insulated gate field effect transistors, a first voltage source line of a fixed potential and having a first portion located near said first group of insulated gate field effect transistors and a second portion located distantly from said first portion and near said second group of insulated gate field effect transistors and a drive circuit for simultaneously setting gates of all of said first and second groups of transistors at said first fixed potential in response to said first control signal, said drive circuit including, a first switching insulated gate field effect transistor located near said first group of insulated gate field effect transistors and electrically coupled between said first portion and gates of said first group of insulated gate field effect transistors, a second switching insulated gate field effect transistor located distantly from said first switching transistor and near said second group of insulated gate field effect transistors and electrically coupled between said second portion and the gates of said second group of insulated gate field effect transistors, and second means coupled to said first means for simultaneously supplying gates of said first and second switching insulated gate field effect transistors with said control signal to thereby make said first and second switching transistors conducting.

2. The circuit according to claim 1, further comprising a second voltage source line biased at a second fixed potential, a third switching insulated gate field transistor electrically coupled between said second voltage source line and the gates of said first and second groups of insulated gate field effect transistors, and means for supplying the gate of said third switching insulated gate field effect transistor with a second control signal different from said first control signal.

3. An integrated circuit comprising a memory cell matrix including a plurality of word lines extending in row direction, a plurality of digit lines extending in column direction, and a plurality of memory cells arranged at intersections of said word lines and said digit lines, said digit lines being divided into first and second groups, a first means for receiving a first voltage, a second means located distantly from said first means and receiving said first voltage, a plurality of first insulated gate field effect transistors coupled between the respective digit lines of said first group and said first means, a plurality of second insulated gate field effect transistors located distantly from said first transistors and coupled between the respective digit lines of said second group and said second means, a first switching gate means located near one of said first transistors, a second switching gate means located near one of said second transistors and distantly from said first switching gate means, a third means located near said first switching means and coupled to said first switching gate means for receiving a second voltage, a fourth means located near said second switching gate means and distantly from said third means and coupled to said second switching gate means for receiving said second voltage, a first circuit connection connecting the gates of said first transistors and to said first switching gate means, a second circuit connection located distantly from said first circuit connection and connecting the gate of said second transistors to said second switching gate means, a fifth means for receiving a first control signal, and a sixth means for simultaneously conducting said first and second switching gate means in response to said first control signal to simultaneously make all of said first and second transistors conductive and thereby to apply said first voltage to said digit lines of said first and second groups.

4. The circuit according to claim 3, in which each of said first and second switching gate means includes an insulated gate field effect transistor.

5. The circuit according to claim 3, further comprising means for receiving a third voltage different from said second voltage, a third switching gate means located near said first switching gate means and adapted to supply the gates of said first insulated gate field effect transistors with said third voltage, a fourth switching gate means located near said second switching gate means and adapted to supply the gates of said second insulated gate field effect transistor with said third voltage, and means for simultaneously controlling said third and fourth gate means in response to a second control signal different from said first control signal.

6. The circuit according to claim 3, in which said first insulated gate field effect transistors are arrayed along a first side of said memory cell matrix and said second insulated gate field effect transistors are arrayed along a second side of said memory cell matrix opposite to said first side.

7. An integrated circuit comprising; means for receiving a first control signal, a first group of field effect transistors arrayed on a first region, a second group of field effect transistors arrayed on a second region separated from said first region, a first voltage line having a first portion located near said first region and a second portion located near said second region, and a switch circuit for simultaneously supplying gates of all of said first and second groups of transistors with a potential of said first voltage line in response to said first control signal, said switch circuit including first switch means located near said first region and adapted to operatively supply gates of all of said first group of transistors with said potential, second switch means located near said second region and adapted to operatively supply gates of all of said second group of transistors with said potential, and means for simultaneously controlling said first and second switch means in response to said first control signal.

8. The circuit according to claim 7, further comprising a plurality of first lines connected to said first group of transistors, and a plurality of second lines connected to said second group of transistors, wherein all of said first lines and second lines are charged to a predetermined potential in response to said first control signal.

9. The circuit according to claim 7, further comprising a second voltage line, third switch means coupled between said second voltage line and said gates of all of said first and second groups of transistors, means for receiving a second control signal different from said first control signal, and means for controlling said third switch means in response to said second control signal.

10. The circuit according to claim 7, further comprising a second voltage line, third switch means located near said first region and coupled between said gates of said first group of transistors and said second voltage line, fourth switch means located near said second region and coupled between said gates of said second group of transistors and said second voltage line, means for receiving a second control signal, and means for simultaneously controlling said third and fourth switch means in response to said second control signal.

* * * * *

UNITED STATES PATENT AND TRADEMARK OFFICE
CERTIFICATE OF CORRECTION

PATENT NO. : 4,467,449

DATED : Aug. 21, 1984

INVENTOR(S) : Mineo HAYASHI

It is certified that error appears in the above-identified patent and that said Letters Patent is hereby corrected as shown below:

Column 3, line 63, "increase" should be --increases--.

Column 4, line 7, "At" should be --An--.

Column 5, line 16, "increases" should be --increase--.

Signed and Sealed this

Thirtieth Day of April 1985

[SEAL]

Attest:

DONALD J. QUIGG

Attesting Officer

Acting Commissioner of Patents and Trademarks